(12) United States Patent
Kondo et al.

(10) Patent No.: US 6,392,265 B2
(45) Date of Patent: May 21, 2002

(54) SEMICONDUCTOR DEVICE (75) Inventors: Kazuaki Kondo; Jeffrey Scott Cross, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/757,666

(22) Filed: Jan. 11, 2001

(30) Foreign Application Priority Data

Jan. 12, 2000 (JP) ........................................ 2000-003837

(51) Int. Cl.[7] ....................... H01L 27/108; H01L 29/94; H01L 31/119; H01L 29/76
(52) U.S. Cl. ........................ 257/295; 257/532
(58) Field of Search ................. 257/295–310, 257/530–535; 438/3, 343–354, 396–398

(56) References Cited

U.S. PATENT DOCUMENTS 6,194,228 B1 * 2/2001 Fujiki et al. ................ 438/3

FOREIGN PATENT DOCUMENTS

| JP | 408340087 A | * 12/1996 |
|---|---|---|
| JP | 9-82906 | 3/1997 |
| JP | 9-191087 | 7/1997 |
| JP | 410182292 A | * 7/1998 |
| JP | 10-214947 | 8/1998 |
| JP | 2924753 | 5/1999 |

* cited by examiner

Primary Examiner—Tom Thomas
Assistant Examiner—Cuong Q Nguyen
(74) Attorney, Agent, or Firm—Armstrong, Westerman & Hattori, LLP (57) ABSTRACT

The semiconductor device comprises a first electrode 36, a ferroelectric film 38 formed on the first electrode, and a second electrode 46 formed on the ferroelectric film. The first electrode or the second electrode comprises $SrRuO_x$ films 30, 40 with Pb and/or Bi added. Pb and Bi are added to the SRO film, whereby the diffusion of the Pb and Bi contained in the ferroelectric film into the SRO film are suppressed, which leads to an improvement of capacitor ferroelectric properties. Thus, the semiconductor device can realize low-voltage operation and hydrogen deterioration resistance by using the SRO film.

8 Claims, 12 Drawing Sheets

SEMICONDUCTOR DEVICE

CROSS-REFERENCE TO RELATED APPLICATIONS

This application is based upon and claims priority of Japanese Patent Application No. 2000-3837, filed, the contents being incorporated herein by reference.

BACKGROUND OF THE INVENTION

The present invention relates to a semiconductor device and a method for fabricating the semiconductor device, more specifically to a semiconductor device comprising the capacitors formed of ferroelectric film.

An FRAM (Ferro-electric Random Access Memory) is a nonvolatile semiconductor memory using ferroelectric film as dielectrics of the capacitors. The FRAM is much noted for the high operation speed and low electric power consumption.

Figure 12:
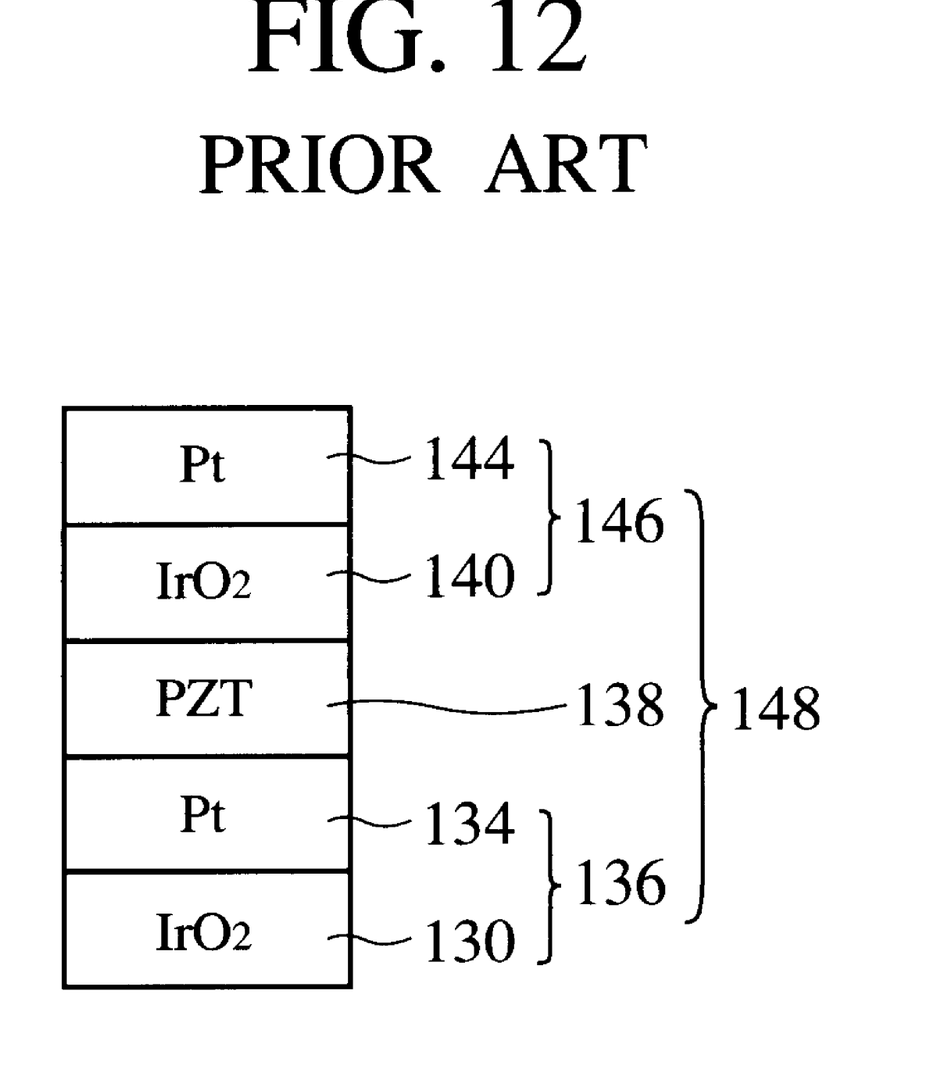
FIG. 12 is a graph showing a constitution of the capacitor of the conventional semiconductor device.

A structure of the capacitors of such FRAM will be explained with reference to FIG. 12. FIG. 12 is a conceptual view of the capacitors of the conventional semiconductor device.

As shown in FIG. 12, an $IrO_2$ film 130 and a Pt film 134 are formed the latter on the former, and the $IrO_2$ film 130 and the Pt film 134 form a lower electrode 136.

A ferroelectric film 138 of a $PbZr_xTi_{1-x}O_3$ (PZT) film or a $SrBi_2Ta_2O_9$ (SBT) film is formed on the lower electrode 136.

An $IrO_2$ film 140 and a Pt film 144 are sequentially formed on the ferroelectric film 138. The $IrO_2$ film 140 and the Pt film 144 form an upper electrode 146.

The lower electrode 136, the ferroelectric film 138 and the upper electrode 146 form a capacitor 148.

However, in a case that, as shown in FIG. 12, the lower electrode 136 and the upper electrode 146 of the capacitor 148 are formed of Ir-family films, it is difficult to realize low-voltage operation and hydrogen deterioration resistance, which are required by the next generation devices.

As an electrode material which is able to realize improved low-voltage operation and hydrogen deterioration resistance, SRO ($SrRuO_x$) film is noted. SRO film, which has perovskite structure, as have PZT and SBT, is not easily damaged in semiconductor device fabrication processes, and is expected to realize low-voltage operation. SRO film is a material of high resistance to hydrogen.

However, a capacitor formed of SRO film used as an electrode material Pb or Bi contained in the ferroelectric film tend to diffuse into the SRO film.

In view of this, a technique which can realize low-voltage operation and hydrogen deterioration resistance by using SRO film.

SUMMARY OF THE INVENTION

An object of the present invention is to provide a semiconductor device which can realize low-voltage operation and hydrogen deterioration resistance by using SRO film.

The above-described object is achieved by a semiconductor device comprising: a first electrode; a ferroelectric film formed on the first electrode; and a second electrode formed on the ferroelectric film, the first electrode or the second electrode comprising $SrRuO_x$ film with Pb and/or Bi added. Pb and Bi are added to the SRO film, whereby the diffusion of the Pb and Bi contained in the ferroelectric film into the SRO film are suppressed, which leads to an improvement of the capacitor ferroelectric properties. Thus, the semiconductor device can realize low-voltage operation and hydrogen deterioration resistance by using the SRO film.

DETAILED DESCRIPTION OF THE INVENTION

A First Embodiment

Figure 1A:
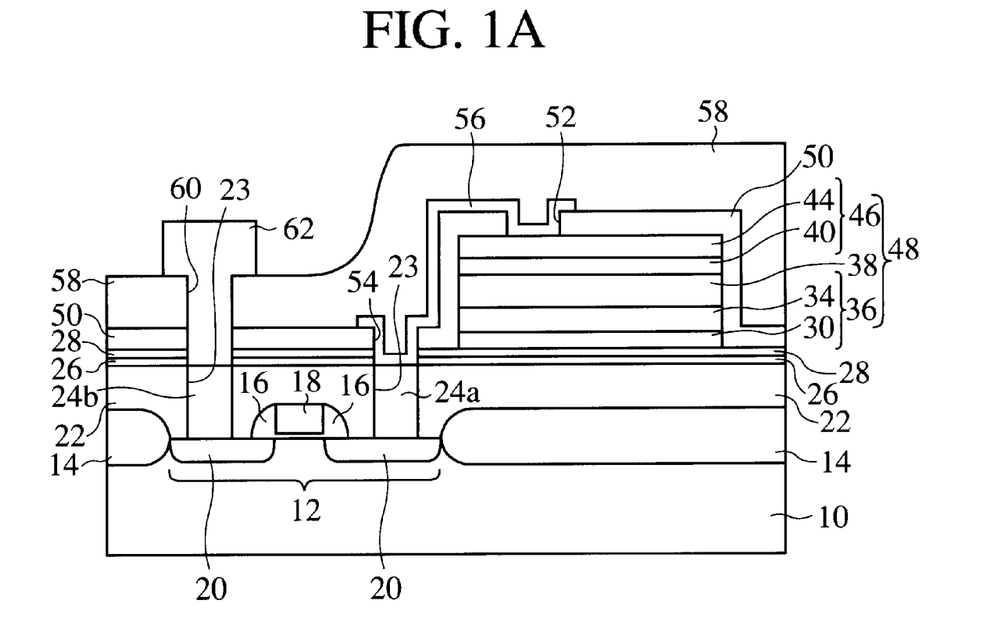
FIGS. 1A and 1B are sectional views of the semiconductor device according to a first embodiment of the present invention.
Figure 1B:
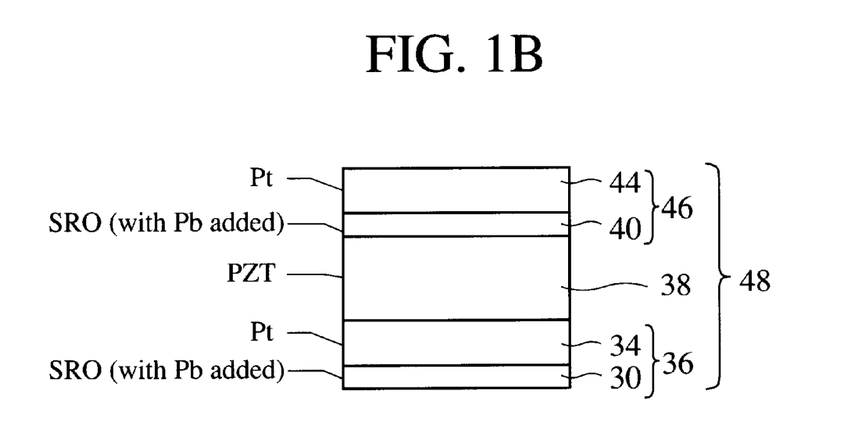
Figure 2:
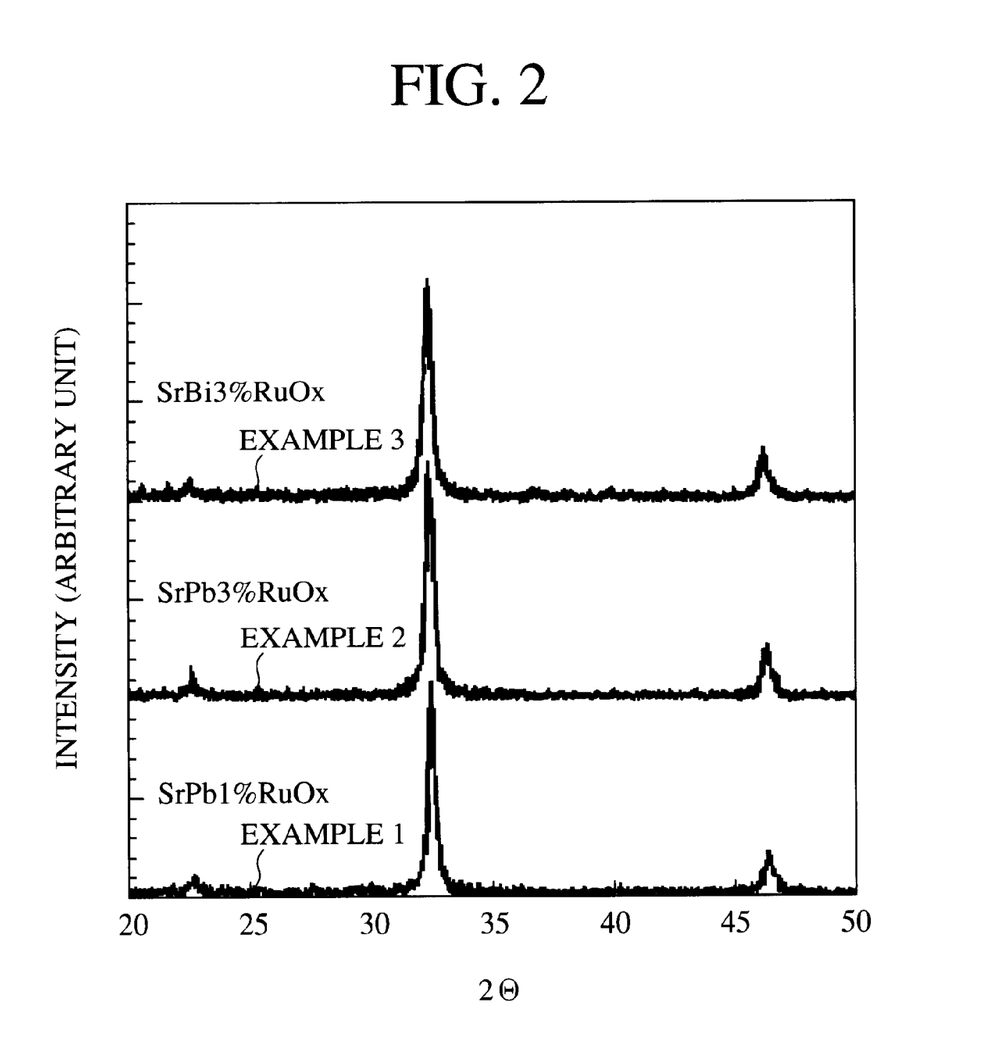
FIG. 2 is a graph of X-ray diffraction patterns of SRO films.

The semiconductor device according to a first embodiment of the present invention and a method for fabricating the semiconductor device will be explained with reference to FIGS. 1A to 6. FIGS. 1A and 1B are sectional views of the semiconductor device according to the present embodiment. FIG. 1B is a view of a structure of the capacitor of the semiconductor device according to the present embodiment. FIG. 2 is a graph of X-ray diffraction patterns of SRO film. FIGS. 3A to 6 are sectional views of the semiconductor device in the steps of the method for fabricating the semiconductor device according to the present embodiment.

Semiconductor Device

In the semiconductor device according to the present embodiment, the present invention is applied to a ferroelectric RAM, i.e., an FRAM.

As shown in FIGS. 1A and 1B, a device isolation film 14 for defining a device region 12 is formed on a silicon substrate 10. In the device region 12 defined by the device isolation film 14 there is formed a transistor including a gate electrode 18 having a sidewall insulation film 16 formed on the side walls, and a source/drain diffused layer 20.

A 600 nm-thickness inter-layer insulation film 22 is formed on the entire surface. A contact hole 23 which arrives at the source/drain diffused layer 20 is formed in the inter-layer insulation film 22. Conductor plugs 24a, 24b are formed in the contact hole 23.

On the inter-layer insulation film 22 there are sequentially formed a stopper film 26 of a 100 nm-thickness silicon oxide nitride film, and a 100 nm-thickness silicon oxide film 28.

On the silicon oxide film 28, a lower electrode 36 of a Pt/SRO structure of a 50 to 500 nm-thickness Pb-added SRO film ($SrRuO_x$) 30 and a 5 to 200 nm-thickness Pt film 34 is formed. An additional amount of Pb for the SRO film 30 is preferably, e.g., below 10% because a too large additional amount of Pb for the SRO film 30 disturbs the crystal structure of the SRO film, i.e., perovskite structure.

On the lower electrode 36, a ferroelectric film 38 of a 230 nm-thickness PZT ($PbZr_xT_{1-x}O_3$) film is formed.

On the ferroelectric film 38 there is formed an upper electrode 46 of a Pt/SRO structure of a 50 to 500 nm-thickness Pb-added SRO film 40 and a 5 to 200 nm-thickness Pt film 44. For the same reason as described above, a Pb additional amount for the SRO film 40 is preferably, e.g., below 10%.

The lower electrode 36, the ferroelectric film 38 and the upper electrode 46 constitute a capacitor 48 for the memory.

A 300 nm-thickness silicon oxide film 50 is further formed on the entire surface. In the silicon oxide film 50, a contact hole 52 arriving at the upper electrode 46, and a contact hole 54 arriving at the conductor plug 24a are formed. On the silicon oxide film 50, a local interconnection for interconnecting the upper electrode 46 and the conductor plug 24a through the contact holes 52, 54 are formed.

Further, an inter-layer insulation film 58 of a 300 nm-thickness silicon oxide film is formed on the entire surface. A contact hole 60 arriving at the conductor plug 24b is formed in the inter-layer insulation film 58, the silicon oxide films 50, 28 and the stopper film 26. A bit line 62 is connected to the conductor plug 24b through the contact hole 60. The semiconductor device according to the present embodiment has such structure.

The semiconductor device according to the present embodiment is characterized in that the lower electrode 36 and the upper electrode 46 comprise the Pb-added SRO films 30, 40. In a case that the upper electrode and the lower electrode comprise pure SRO films, Pb contained in the ferroelectric film of PZT film tends to diffuse into the SRO films. In the present embodiment, however, Pb is added to the SRO films, whereby the diffusion of the Pb contained in the ferroelectric film 38 into the SRO film can be suppressed, which leads to an improvement of the capacitor ferroelectric properties. Thus, the semiconductor device according to the present embodiment can realize low-voltage operation and hydrogen deterioration resistance by using the SRO film.

Crystal Structure of the SRO Film

Then, a crystal structure of the Pb-added SRO film will be explained with reference to FIG. 2. FIG. 2 is a graph of X-ray diffraction patterns of the SRO film. The X-ray diffraction patterns shown in FIG. 2 were given by X-ray diffraction (XRD) for applying X-rays to a sample and recording diffraction images of scattered X-rays to analyze a crystal structure of the sample.

Example 1 shows X-ray diffraction patterns of the SRO film with Pb added by 1%. Example 2 shows X-ray patterns of the SRO film with Pb added by 3%.

As shown in FIG. 2, even with the increase and decrease of the Pb additional amount, the X-ray diffraction patterns of the SRO film are substantially the same. Based on this, it is considered that the addition of Pb to the SRO film does not especially affect the crystal structure of the SRO film, i.e., perovskite structure.

Accordingly, the semiconductor device according to the present embodiment can realize low-voltage operation and improved hydrogen deterioration resistance by using the SRO films.

Method for Fabricating the Semiconductor Device

The method for fabricating the semiconductor device according to the present embodiment will be explained with reference to FIGS. 3A to 6.

Figure 3A:
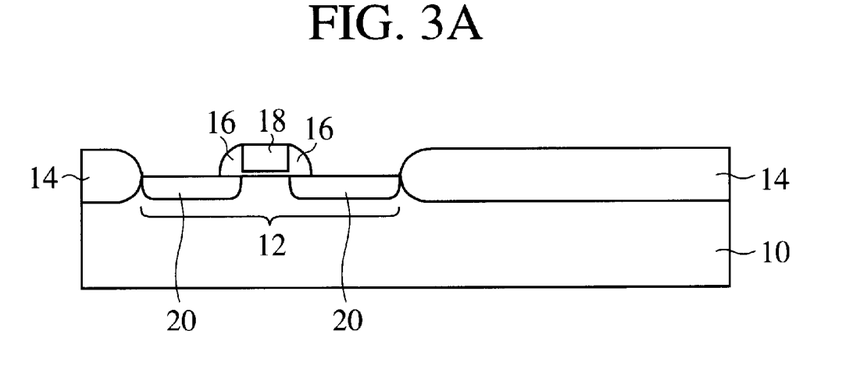
FIGS. 3A to 3C are sectional views of the semiconductor device according to the first embodiment of the present invention in the steps of the method for fabricating the semiconductor device, which show the method (Part 1).

First, as shown in FIG. 3A, the device isolation film 14 for defining a device region 12 is formed on the surface of a silicon substrate 10 by LOCOS (LOCal Oxidation of Silicon).

Next, a transistor including a gate electrode 18 with the sidewall insulation film 16 formed on the side walls, and the source/drain diffused layer 20 is formed in the device region 12.

Next, the 600 nm-thickness inter-layer insulation film 22 is formed of silicon oxide film on the entire surface by CVD (Chemical Vapor Deposition), and then the surface of the inter-layer insulation film 22 is planarized by CMP (Chemical Mechanical Polishing).

Contact holes 23 are formed in the inter-layer insulation film 22 by photolithography down to the source/drain diffused layer 20.

Figure 3B:
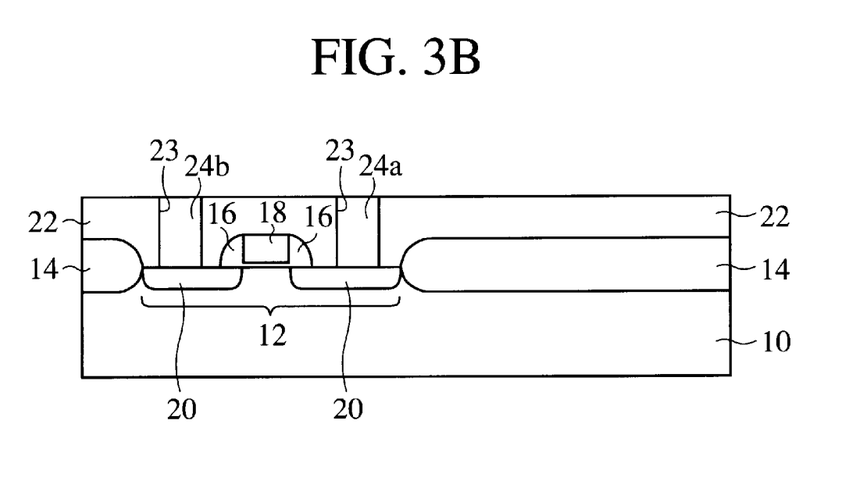

Then, the 20 nm-thickness Ti film and the 50 nm-thickness TiN film are sequentially formed on the entire surface by sputtering to thereby form an adhesion layer of Ti film and TiN film. Then, the 600 nm-thickness tungsten layer is formed on the entire surface by CVD.

Next, the tungsten layer and the adhesion layer are polished by CMP until the surface of the inter-layer insulation film 22 is exposed. Thus, the conductor plugs 24a, 24b of the adhesion layer and the tungsten layer are formed in the contact holes 23 (see FIG. 3B).

Figure 3C:
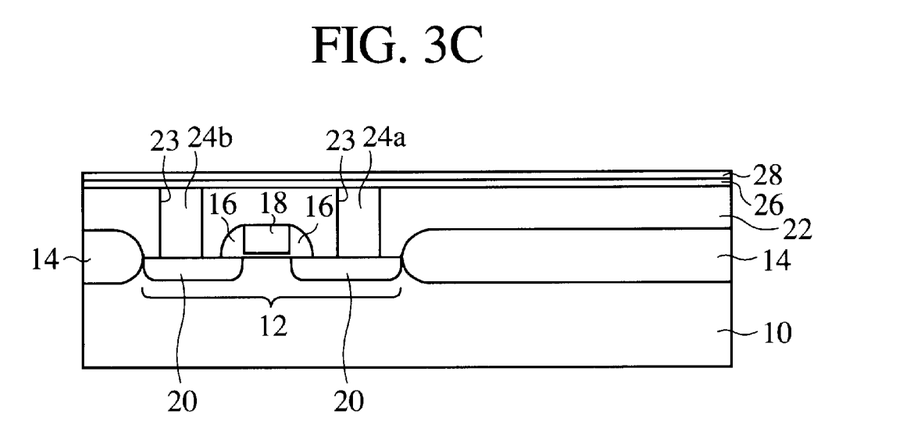

Then, the stopper film 26 of a 100 nm-thickness silicon oxide nitride film and the 100 nm-thickness silicon oxide film 28 are sequentially formed on the entire surface by CVD (see FIG. 3C).

Next, the 50 to 500 nm-thickness SRO film 30 with Pb added is formed by sputtering. As a film forming condition for the SRO film 30, for example, a target of Pb-added SRO may be used. As a sputter power, either of DC and RF can be used and suitably set at, e.g., 0.3 to 3.0 $Wcm^{-2}$. A flow rate ratio between Ar gas and $O_2$ gas can be suitably set within, e.g., 99:1 to 50:50. A pressure in the film forming chamber can be suitably set within, e.g., 0.5 to 4.0 Pa. A substrate temperature can be suitably set within, e.g., the room temperature to 700° C.

The 5 to 200 nm-thickness Pt film 34 is formed on the entire surface in an Ar atmosphere by sputtering. Film forming conditions can be, e.g., a target of Pt, a 0.5 to 5.0 W power, a 50 to 200 sccm Ar flow rate and a substrate temperature of the room-temperature to 500° C.

Next, the 230 nm-thickness PbZr$_x$Ti$_{1-x}$O$_3$(PZT) film is formed on the entire surface by sputtering or CSD (Chemical Solution Decomposition). Then, thermal processing is made at 550 to 750° C. to crystallize the PZT film into perovskite structure. Thus, the feeroelectric film 38 of the PZT film is formed (see FIG. 4A).

Figure 4A:
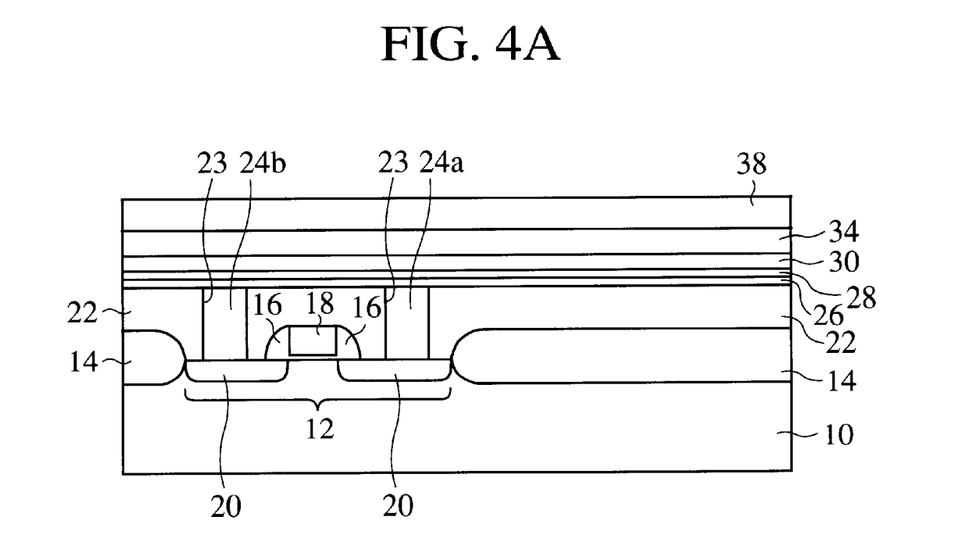
FIGS. 4A and 4B are sectional views of the semiconductor device according to the first embodiment of the present invention in the steps of the method for fabricating the semiconductor device, which show the method (Part 2).
Figure 4B:
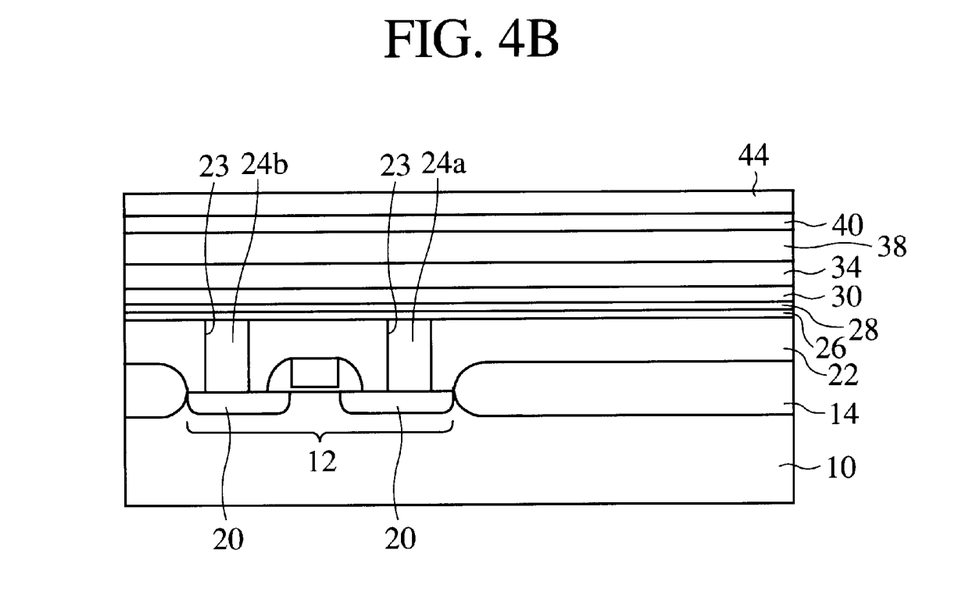

Next, in the same way as the SRO film 30 is formed, the 50 to 500 nm-thickness SRO film 40 is formed on the entire surface.

Then, in the same as the Pt film 34 is formed, the 5 to 200 nm-thickness Pt film 44 is formed on the entire surface.

Next, thermal processing for improving capacitor characteristics is made at 550 to 700° C. (see FIG. 4B).

Then, the Pt film 44, the SRO film 40, the ferroelectric film 38, the Pt film 34 and the SRO film 30 are patterned by photolithography. Thus, the SRO film 30 and the Pt film 34 constitute the lower electrode 36 of the Pt/SRO structure, the SRO film 40 and the Pt film 44 constitute the upper electrode 46 of the Pt/SRO structure, and the lower electrode 36, the ferroelectric film 38 and the upper electrode 46 constitute the capacitor 48 (see FIG. 5A). Dry etching can be used for the patterning, and an etching gas can be a gas containing, e.g., Cl$_2$, O$_2$ and Ar.

Figure 5A:
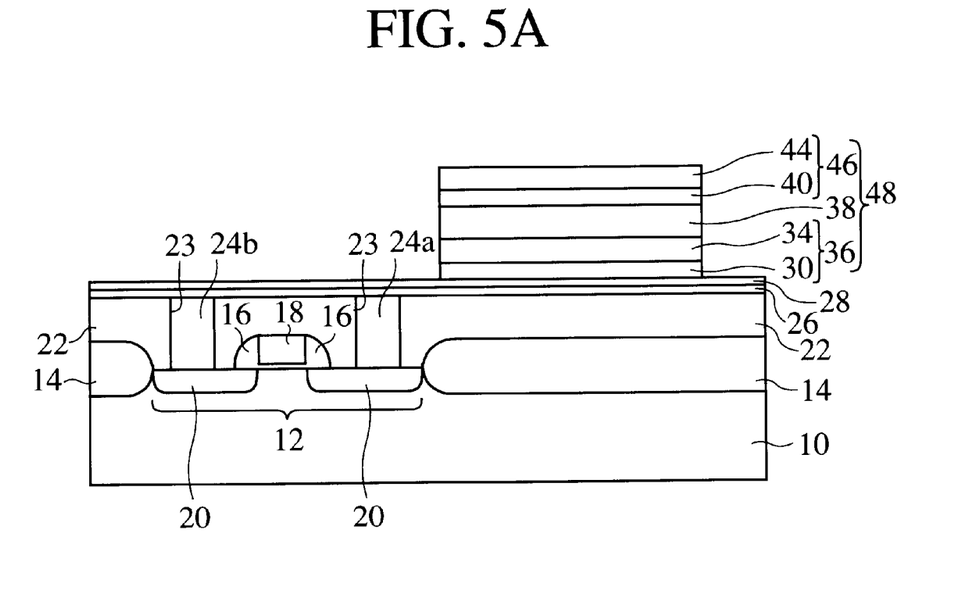
FIGS. 5A and 5B are sectional views of the semiconductor device according to the first embodiment of the present invention in the steps of the method for fabricating the semiconductor device, which show the method (Part 3).

Then, the 300 nm-thickness silicon oxide film is formed on the entire surface.

Figure 5B:
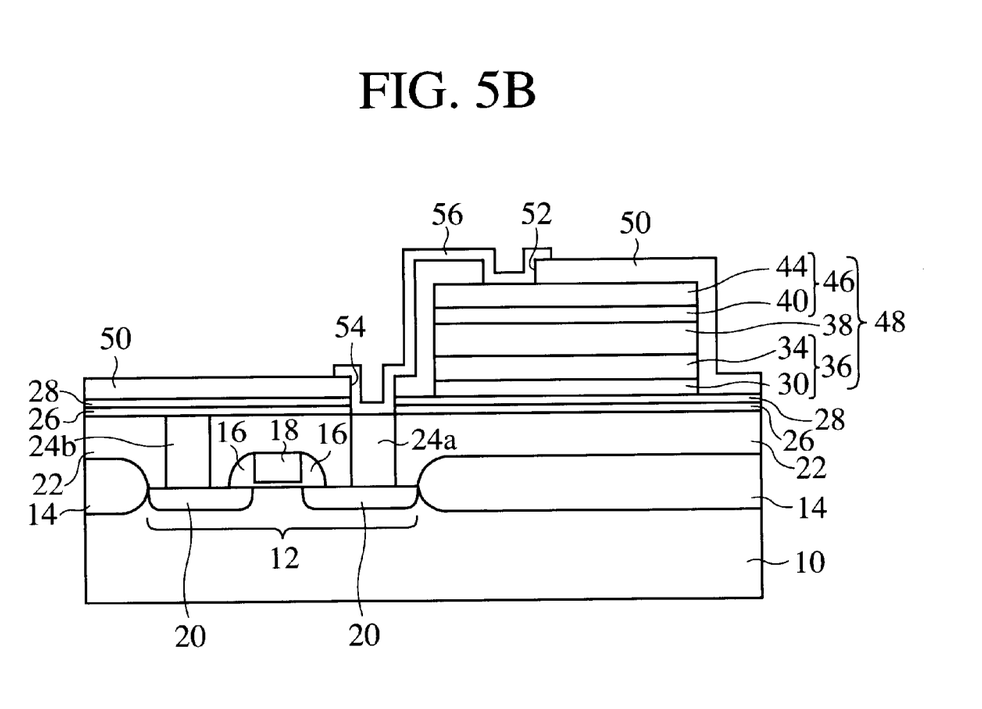

Next, the contact hole 52 is formed in the silicon oxide film 50 down to the upper electrode 46 by photolithography. The contact hole 54 is formed down to the conductor plug 24a in the silicon oxide films 50, 28 and the stopper film 26.

Next, a TiN film is formed on the entire surface. Then, the TiN film is patterned by photolithography to form the local interconnection 56 which interconnects the upper electrode 46 and the conductor plug 24a through the contact holes 52, 54 (see FIG. 5B).

Figure 6:
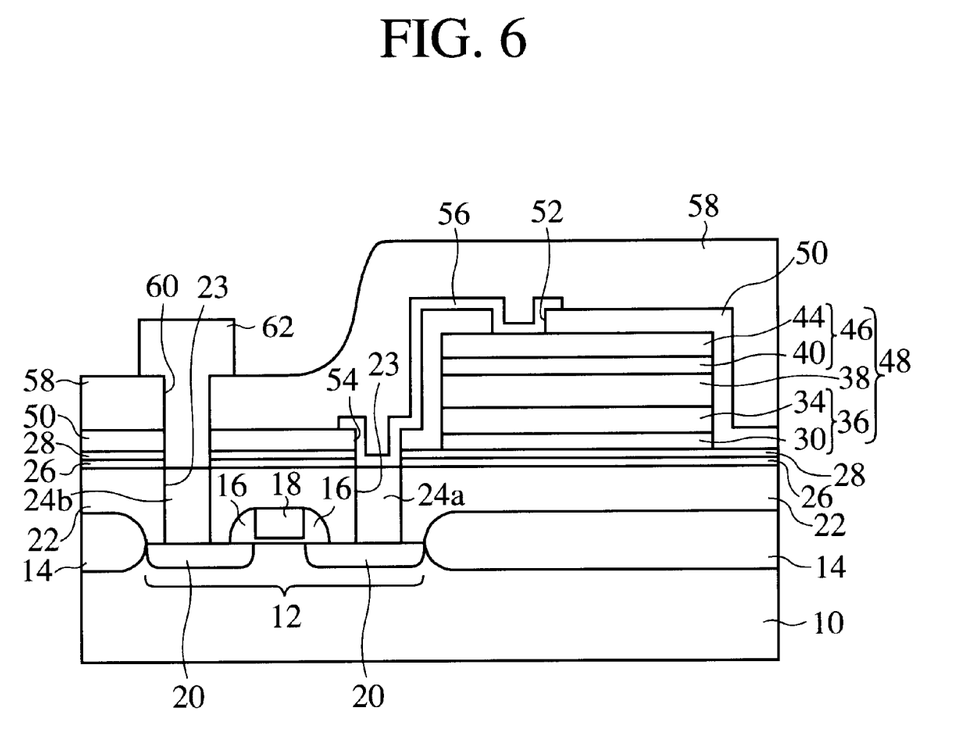
FIG. 6 is sectional views of the semiconductor device according to the first embodiment of the present invention in the steps of the method for fabricating the semiconductor device, which show the method (Part 4).

Next, the inter-layer insulation film 58 of a 300 nm-thickness silicon oxide film is formed on the entire surface.

Then, the contact hole 60 is formed by photolithography in the inter-layer insulation film 58, the silicon oxide films 50, 28 and the stopper film 26 down to the conductor plug 24b.

Next, a 600 nm-thickness Al film is formed on the entire surface. Then, the Al film is patterned to form the bit line 62 connected to the conductor plug 24b through the contact hole 60 (see FIG. 6).

Thus, the semiconductor device according to the present embodiment is fabricated.

Modifications

Figure 7A:
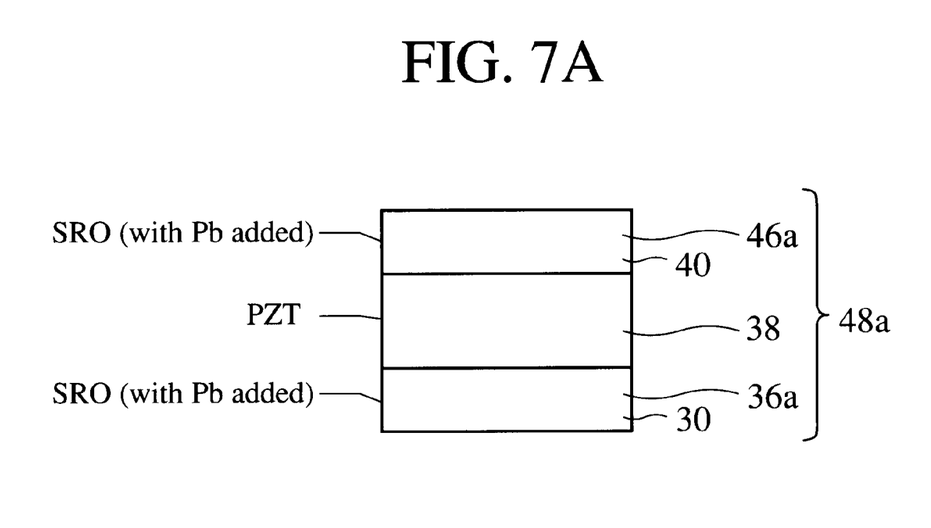
FIGS. 7A and 7B are sectional views of modifications of the capacitor of the semiconductor device according to the first embodiment, which show electrode structures of the modifications.
Figure 7B:
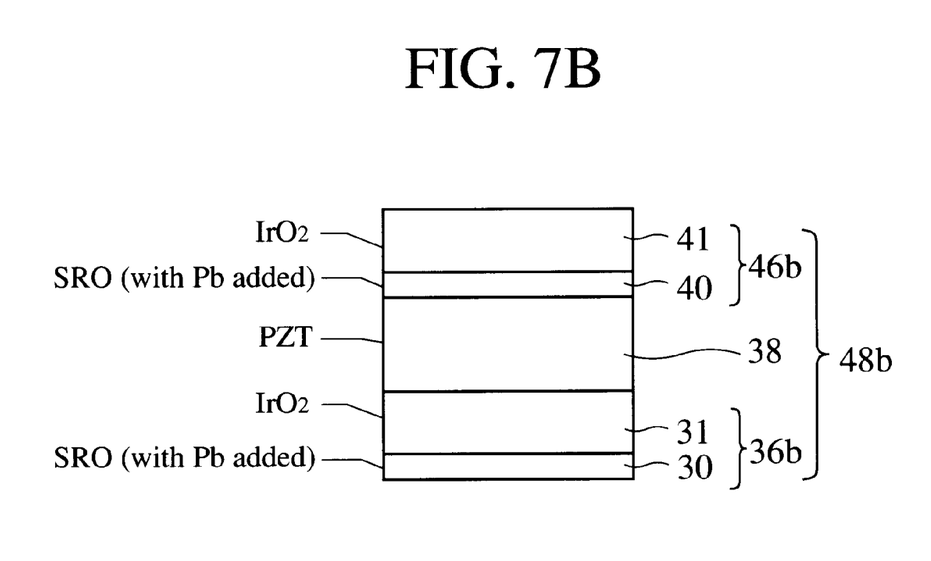

Then, modifications of the structure of the capacitor will be explained with reference to FIGS. 7A and 7B. FIG. 7A is a sectional view of the capacitor of a modification (Modification 1), which shows a structure of the capacitor. FIG. 7B is a sectional view of the capacitor of a modification (Modification 2), which shows a structure of the capacitor. In FIGS. 7A and 7B, the constituent members other than the capacitor are not shown.

In the capacitor shown in FIG. 7A, the lower electrode 36a is formed of, e.g., the SRO film 30 alone of a 60 nm-thickness with Pb added, and the upper electrode 46a is formed of, e.g., the SRO film 40 alone of a 60 nm-thickness with Pb added. The ferroelectric film 38 is formed between the lower electrode 36a and the upper electrode 46a. The lower electrode 36a, the ferroelectric film 38 and the upper electrode 46a constitute the capacitor 48a. In the capacitor shown in FIG. 7A, the SRO films 30, 40 with Pb added are in direct contact with the ferroelectric film 38 of PZT film, whereby the diffusion of Pb can be further suppressed in comparison with the diffusion in the case that Pt film or others are formed between the ferroelectric film and the SRO film. Also in the capacitor 48a shown in FIG. 7A, because no Pt film is used in the lower electrode 36a and the upper electrode 46a, even when the lower electrode 36a and the upper electrode 46a are exposed to a hydrogen atmosphere in the fabrication process, the lower electrode 36a and the upper electrode 46a do not easily react with the hydrogen, and accordingly the deterioration of the capacitor 48a can be suppressed. The SRO films 30, 40 having perovskite structure, and the ferroelectric film 38 having perovskite structure are in direct contact with each other, whereby the capacitor can realize good electric characteristics.

In the capacitor shown in FIG. 7B, the lower electrode 36b of the IrO$_2$/SRO structure is formed of the SRO film 30 of a 60 nm-thickness with Pb added, and a 50 nm-thickness IrO$_2$ film 31, and the upper electrode 46b of the IrO$_2$/SRO structure is formed of the SRO film 40 of a 15 nm-thickness with Pb added, and a 50 nm-thickness IrO$_2$ film 41. The ferroelectric film 38 is formed between the lower electrode 36b and the upper electrode 46b. The lower electrode 36b, the ferroelectric film 38 and the upper electrode 46b constitute the capacitor 48b. That is, in the capacitor shown in FIG. 7B, the IrO$_2$/SRO structure is applied to the lower electrode 36b and the upper electrode 46b. The IrO$_2$ film has the effect of suppressing the diffusion of Sr, and has good adhesion to the SRO film. Accordingly, these modifications can realize improve properties of the ferroelectric capacitor.

As described above, structures of the electrodes, film thickness, etc. may be suitably set in consideration of structures characteristic of the semiconductor device and aimed electric characteristics.

A Second Embodiment

Figure 8A:
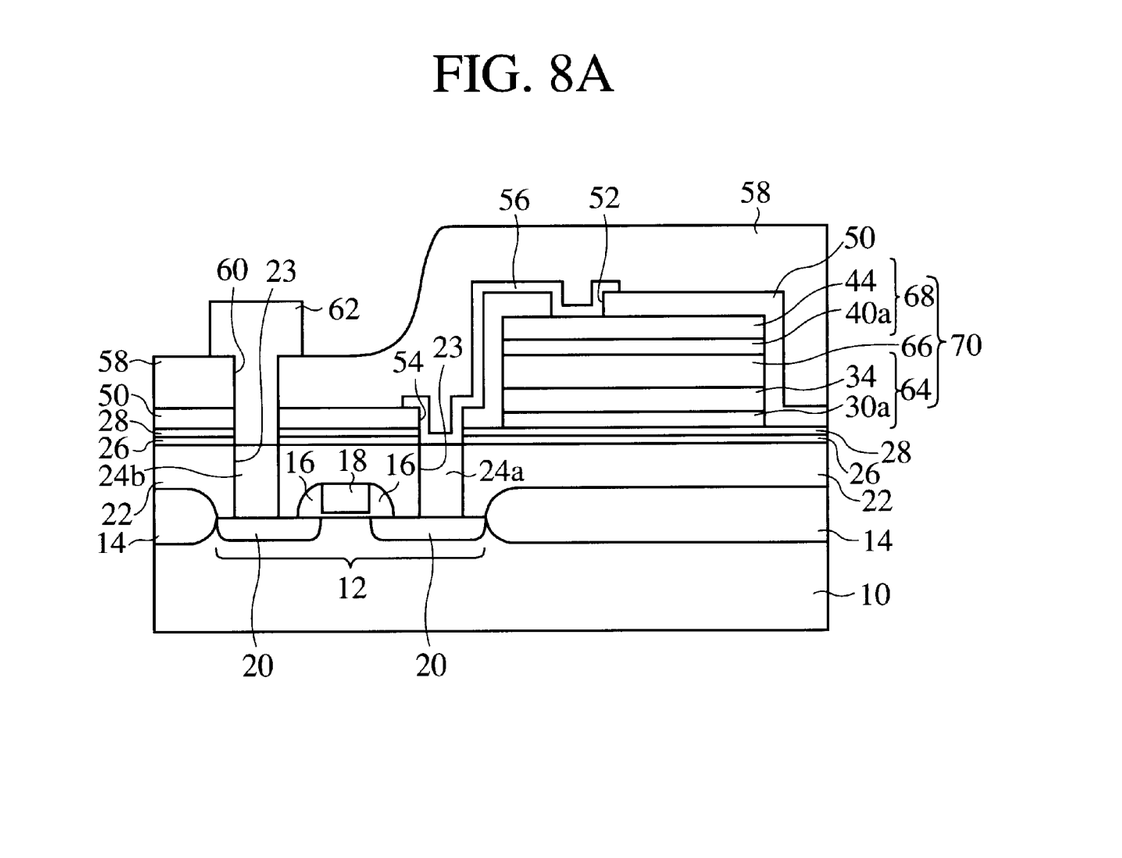
FIGS. 8A and 8B are sectional views of the semiconductor device according to a second embodiment of the present invention.
Figure 8B:
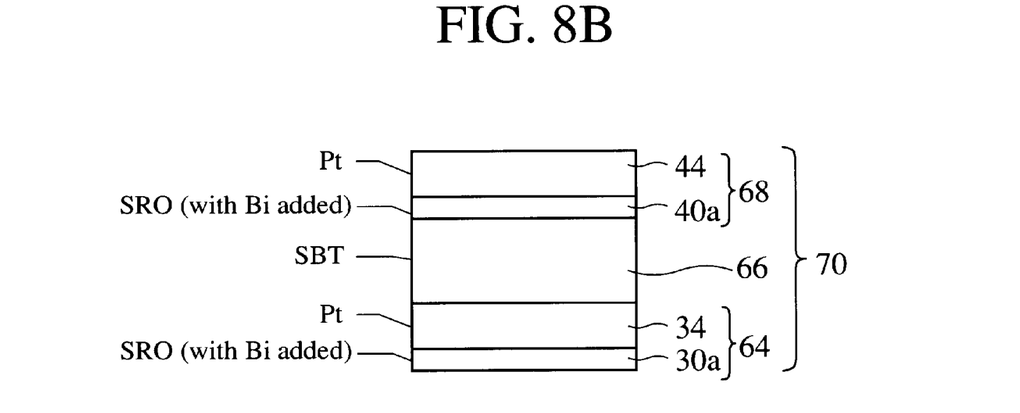

The semiconductor device according to a second embodiment of the present invention and a method for fabricating the semiconductor device will be explained with reference to FIGS. 8A and 8B. FIG. 8A is sectional views of the semiconductor device according to the present embodiment. FIG. 8B is a view of a structure of the capacitor of the semiconductor device according to the present embodiment. The same members of the present embodiment as those of the semiconductor device according to the first embodiment and the method for fabricating the same shown in FIGS. 1A to 7B are represented by the same reference numbers not to repeat or to simplify their explanation.

Semiconductor Device

As shown in FIGS. 8A and 8B, on a silicon oxide film 28 there is formed a lower electrode 64 of the Pt/SRO structure of a 50 to 500 nm-thickness SRO film 30a with Bi added and a 5 to 200 nm-thickness Pt film 34. A Bi additional amount for the SRO film 30a is preferably below, e.g., 10% because an excessive additional amount of Bi for the SRO film 30a disturbs the crystal structure, i.e., perovskite structure.

On the lower electrode 64, a ferroelectric film 66 of a 230 nm-thickness SBT (SrBi$_2$Ta$_2$O$_9$) film is formed.

On the ferroelectric film 66 there is formed an upper electrode 68 of the Pt/SRO structure of a 50 to 500 nm-thickness SRO film 40a with Bi added and a 5 to 200 nm-thickness Pt film 44. For the reason described above, a Bi additional amount for the SRO film 40a is preferably below, e.g., 10%.

The lower electrode 64, the ferroelectric film 66 and the upper electrode 68 constitute a capacitor 70 for the memory.

The semiconductor device according to the present embodiment is characterized mainly in that the ferroelectric film 66 of the capacitor is SBT film, the lower electrode 64 and the upper electrode 68 include the SRO films 30a, 40a with Bi added. In a case that the lower electrode and the upper electrode comprise pure SRO films, the Bi contained in the ferroelectric film of SBT film diffuses into the SRO films with a result of large leakage current. In the present embodiment, however, Bi is added to the SRO films 30a, 40a, whereby the diffusion of the Bi contained in the ferroelectric film 66 can be suppressed. Thus, according to the present embodiment, in which the upper electrode and the lower electrode of the capacitor comprise SRO film, the leakage current can be depressed.

Crystal Structure of SRO Film

Next, a crystal structure of the SRO film with Bi added will be explained with reference to FIG. 2.

In FIG. 2, Example 3 shows X-ray diffraction pattern of the SRO film with Bi added by 3%. As shown in FIG. 2, the X-ray diffraction pattern of Example 3 is substantially the same as those of the X-ray diffraction patterns of Examples 1 and 2.

Based on this it is considered that even the addition of Bi to the SRO film remarkably affects the crystal structure of the SRO film.

Thus, the semiconductor device according to the present embodiment can realize low-voltage operation and improved hydrogen deterioration resistance.

Method for Fabricating the Semiconductor Device

Next, the method for fabricating the semiconductor device according to the present embodiment will be explained.

The steps of the method for fabricating the semiconductor device up to the step of forming a silicon oxide film 28 including the silicon oxide film forming step are the same as those of the method for fabricating the semiconductor device according to the first embodiment shown in FIGS. 3A to 3C, and their explanation will not be repeated.

Then, a 10 to 200 nm-thickness SRO film 30a with Bi added is formed by sputtering. As a condition for forming the SRO film 30a, for example, a target of SRO with Bi added can be used. As a sputter power, either of DC and RF may be used and can be suitably set within a range of, e.g., 0.3 to 3.0 Wcm$^{-2}$. A flow rate ratio between Ar gas and $O_2$ gas can be suitably set within a range of, e.g., 99:1 to 50:50. A pressure in the film forming chamber can be suitably set within a range of 0.5 to 4.0 Pa. A substrate temperature can be suitably set within a range of, e.g., the room temperature to 700° C.

Next, in the same way as in the first embodiment, a 100 to 200 nm-thickness Pt film 34 is formed.

Then, a ferroelectric film 66 is formed of SBT film, which is ferroelectric film, on the entire surface by CVD. As film forming conditions, for example, a substrate temperature is 400° C., a pressure in the film forming chamber is 7 Torr, a flow rate of solution materials is 0.1 cc/min, a solution material composition ratio is Sr:Bi:Ta=1.5:7.3:2, a total carrier gas flow rate is 1.5 slm, and a carrier gas $O_2/N_2$ flow rate ratio is 50%. Solution materials are $Sr(DPM)_2$ (strontium bis-dipivaloylmethanate), $Bi(Ph)_3$ (triphenyl bismuth), and $Ta(OiPr)_4(DPM)$ (tantalum tetrakis-isopropoxy dipivaloylmethanate) which are solved by THF (tetrahydrofuran).

Then, thermal processing is made at 700° C. to crystallize the SBT film into perovskite structure. The ferroelectric film 66 of SBT film is thus formed.

Then, by the same process for forming the SRO film 30a, the 10 to 200 nm-thickness SRO film 40a with Bi added is formed on the entire surface.

Next, in the same way as in the first embodiment, the 50 to 150 nm-thickness Pt film 44 is formed on the entire surface.

Next, thermal processing is made at 550 to 700° C. for improving capacitor characteristics.

Then, the steps which are the same as those of the method for fabricating the semiconductor device according to the first embodiment shown in FIGS. 5A to 6 follow, and their explanation will not be repeated. The semiconductor device according to the present embodiment is thus fabricated.

Modifications

Figure 9A:
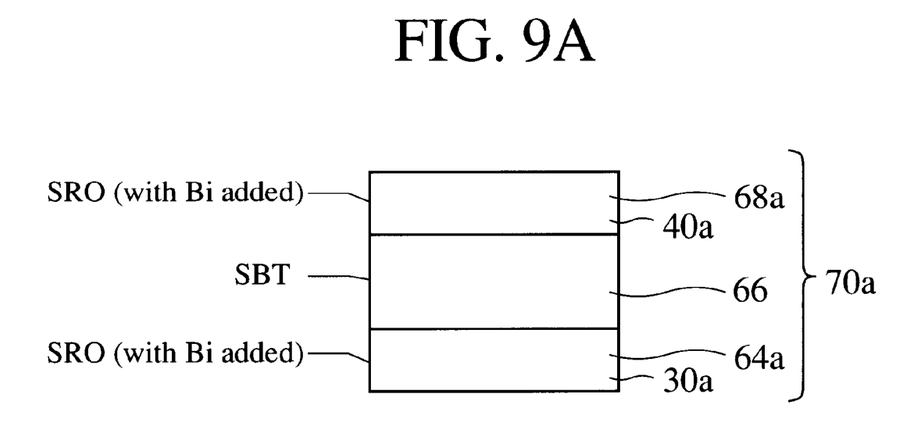
FIGS. 9A and 9B are sectional views of modifications of the electrode structure of the capacitor of the semiconductor device according to the second embodiment of the present invention.
Figure 9B:
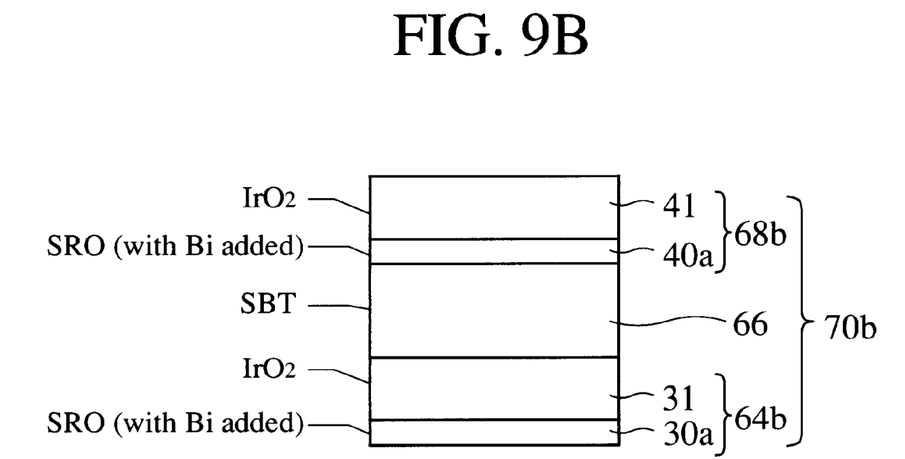

Next, modification of the electrode structure of the capacitor will be explained with reference to FIGS. 9A and 9B. FIG. 9A is a sectional view of a modification (Modification 1) of the electrode structure of the capacitor. FIG. 9B is a sectional view of a modification (Modification 2) of the electrode structure of the capacitor. In FIGS. 9A and 9B, the constituent members except the capacitor are not shown.

The capacitor 70a shown in FIG. 9A comprises, as does the capacitor 48a shown in FIG. 7A, the lower electrode 64a of a layer alone of SRO film, and the upper electrode 68a of a layer alone of SRO film. Accordingly, the present modification can produce the same effects as the capacitor shown in FIG. 7A.

The capacitor shown in FIG. 9B comprises the lower electrode 64b and the upper electrode 68b of $IrO_2$/SRO structure as does the capacitor 48b shown in FIG. 7B. Accordingly, Modification 2 can produce the same effects as the capacitor shown in FIG. 7B.

As described above, an electrode structure, film thickness, etc. may be suitably set in consideration of a structure characteristic of a semiconductor device, aimed electric characteristics, etc.

A Third Embodiment

Figure 10A:
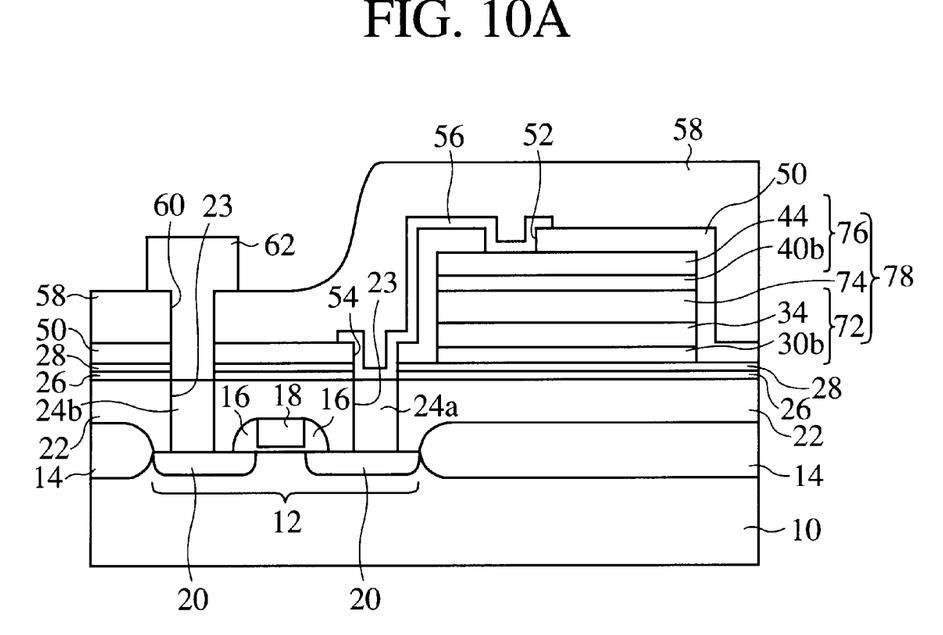
FIGS. 10A and 10B are sectional views of the semiconductor device according to a third embodiment of the present invention.
Figure 10B:
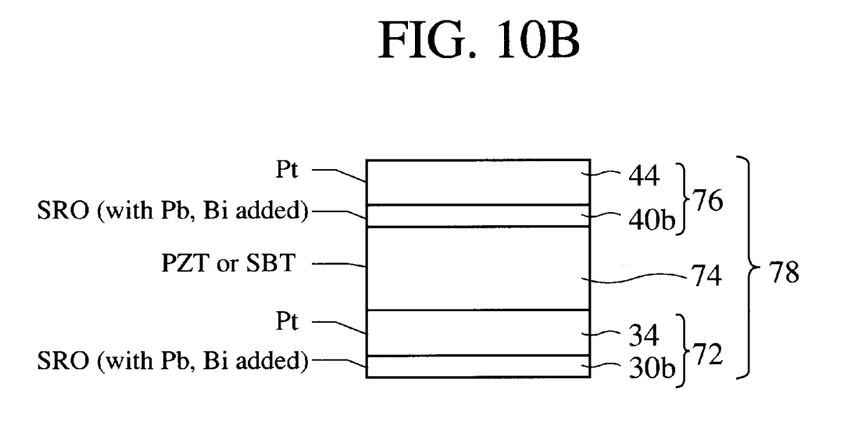

The semiconductor device according to a third embodiment of the present invention and a method for fabricating the semiconductor device will be explained with reference to FIGS. 10A and 10B. FIG. 10A is sectional views of the semiconductor device according to the present embodiment. FIG. 10B is a view of a structure of the capacitor of the semiconductor device according to the present embodiment. The same members of the present embodiment as those of the semiconductor device according to the first embodiment and the method for fabricating the same shown in FIGS. 1A to 9B are represented by the same reference numbers not to repeat or to simplify their explanation.

Semiconductor Device

As shown in FIGS. 10A and 10B, on a silicon oxide film 28 there is formed a lower electrode 72 of the Pt/SRO structure of a 50 to 500 nm-thickness SRO film 30b with Pb and Bi added and a 5 to 200 nm-thickness Pt film 34. A Pb additional amount and a Bi additional amount for the SRO film 30b are, e.g., below 10%.

A ferroelectric film 74 of a 230 nm-thickness PZT or SBT film is formed on the lower electrode 72.

On the ferroelectric film 74 there is formed an upper electrode of the Pt/SRO structure of a 50 to 500 nm-thickness SRO film 40b with Pb and Bi added and a 5 to 200 nm-thickness Pt film 44. A Pb additional amount and a Bi additional amount for the SRO film are, e.g., below 10%.

The lower electrode 72, the ferroelectric film 74 and the upper electrode 76 constitute a capacitor 78 of the memory.

The semiconductor device according to the present embodiment is characterized mainly in that the lower electrode 72 and the upper electrode 76 of the capacitor comprise the SRO films 30b, 40b with Pb and Bi added. The SRO films 30b, 40b contain Pb and Bi, whereby in either case that the ferroelectric film 74 is formed of PZT film or SBT film, the diffusion of the Pb and Bi into the SRO films 30b, 40b can be suppressed. That is, according to the present embodiment, the ferroelectric film of the capacitor is formed of either of PZT film and SBT film, whereby the ferroelectric capacitor properties can be improved.

Method for Fabricating the Semiconductor Device

Then, the method for fabricating the semiconductor device according to the present embodiment will be explained.

The steps of the method for fabricating the semiconductor device up to the step of forming a silicon oxide film 28 including the silicon oxide film forming step are the same as those of the method for fabricating the semiconductor device according to the first embodiment shown in FIGS. 3A to 3C, and their explanation will not be repeated.

Then, a 10 to 200 nm-thickness SRO film 30b with Pb and Bi added is formed by sputtering. As a condition for forming the SRO film 30b, for example, a target of SRO with Pb and Bi added can be used. As a sputter power, either of DC and RF may be used and can be suitably set within a range of, e.g., 0.3 to 3.0 Wcm$^{-2}$. A flow rate ratio between Ar gas and O$_2$ gas can be suitably set within a range of, e.g., 99:1 to 50:50. A pressure in the film forming chamber can be suitably set within a range of 0.5 to 4.0 Pa. A substrate temperature can be suitably set within a range of, e.g., the room temperature to 700° C.

Next, in the same way as in the first embodiment, a 100 to 200 nm-thickness Pt film 34 is formed.

Then, in the same way as in the first or the second embodiment, the ferroelectric film 74 of PZT film or SBT film is formed.

Next, thermal processing is made at 700° C. to crystallize the ferroelectric film 74 into perovskite structure. The ferroelectric film 74 of PZT film or SBT film is thus formed.

Then, by the same process for forming the SRO film 30b, the 10 to 200 nm-thickness SRO film 40b with Pb and Bi added is formed.

Then, in the same way as in the first embodiment, the 50 to 150 nm-thickness Pt film 44 is formed on the entire surface.

Next, thermal processing is made at 550 to 700° C. for improving characteristics of the capacitor.

This step is followed by the same steps of the method for fabricating the semiconductor device according to the first embodiment shown in FIGS. 5A to 6, and the explanation of the steps will not be repeated. The semiconductor device according to the present embodiment is thus fabricated.

Modifications

Figure 11A:
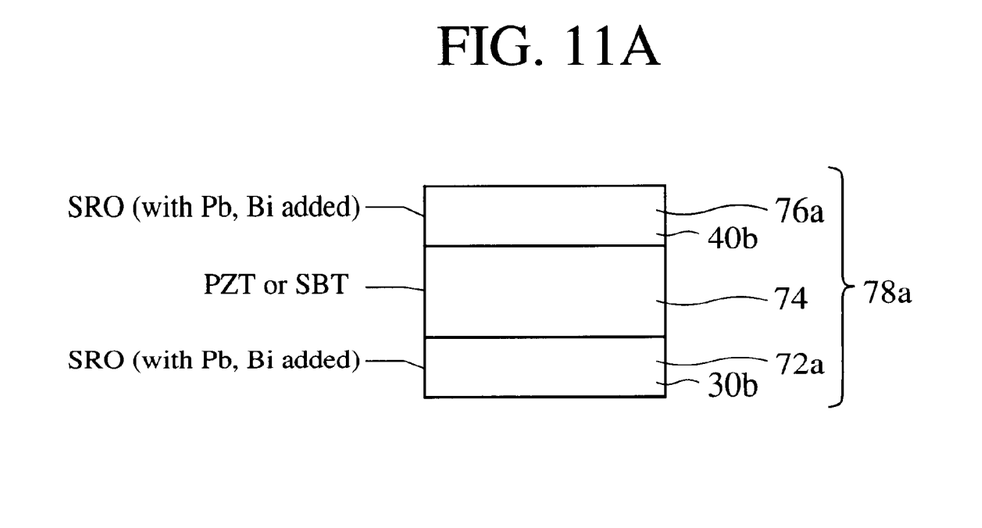
FIGS. 11A and 11B are sectional views of modifications of the electrode structure of the capacitor of the semiconductor device according to the third embodiment of the present invention.
Figure 11B:
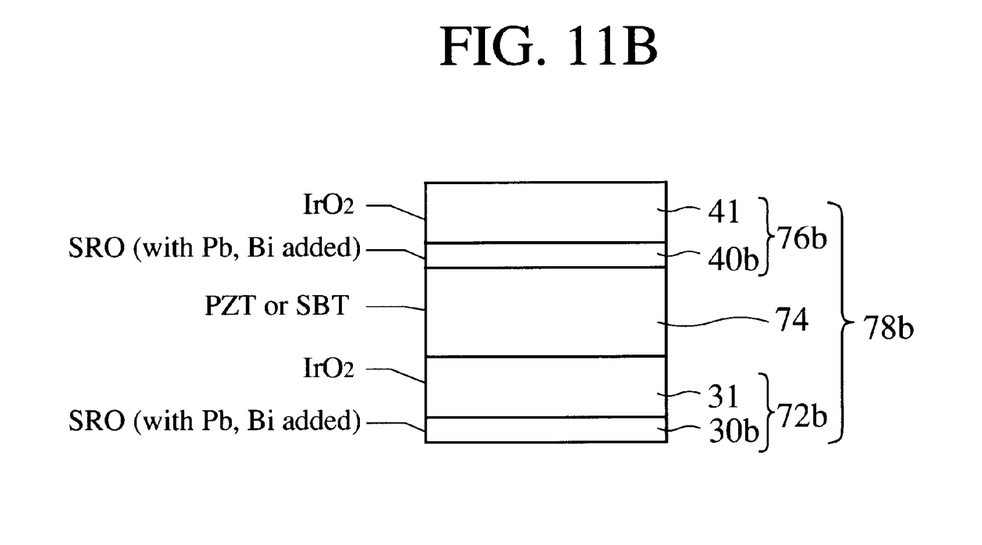

Then, modifications of the electrode structure of the capacitor will be explained with reference to FIGS. 11A and 11B. FIG. 11A is a sectional view of a modification (Modification 1) of the electrode structure of the capacitor. FIG. 11B is a sectional view of a modification (Modification 2) of the electrode structure of the capacitor. In FIGS. 11A and 11B, the constituent members except the capacitor are not shown.

The capacitor 78a shown in FIG. 11A comprises a lower electrode 72a and an upper electrode 76a each formed of a single layer of SRO film alone, as does the capacitor 48a shown in FIG. 7A. Accordingly, Modification 1 can produce the same effects as the capacitor shown in FIG. 7A.

The capacitor 78b shown in FIG. 11B comprises a lower electrode 72b and an upper electrode 76b of the IrO$_2$/SRO structure, as does the capacitor 48b shown in FIG. 7B. Accordingly, Modification 2 can produce the same effects as the capacitor shown in FIG. 7B.

As described above, an electrode structure, film thickness, etc. can be suitably set in consideration of a structure characteristic of a semiconductor device, aimed electric characteristics, etc.

Modified Embodiments

The present invention is not limited to the above-described embodiment and can cover other various modifications.

For example, in the first to the third embodiments, the present invention is applied to FRAM. However, the present invention is not limited to FRAM and is applicable to all the semiconductor devices having capacitors which comprise ferroelectric film.

In the first to the third embodiment, both the upper electrode and the lower electrode comprise SRO film. However, it is possible that either of the upper and the lower electrodes comprises SRO film.

In the first to the third embodiments, the upper electrode and the lower electrode have the Pt/SRO structure. However, the upper electrode and the lower electrode do not have essentially the Pt/SRO structure and may have, e.g., Pt/IrO$_x$/SRO structure.

In the first to the third embodiment, the upper electrode and the lower electrode comprise Pt film. However, Pt film is not essential, and the upper electrode and the lower electrode may comprise, e.g., Pt-content alloy films.

In the first to the third embodiments, SRO film with Pb and Bi added is used. However, additives to be added to the SRO film may be suitably changed corresponding to materials of the ferroelectric film.

In the first to the third embodiments, the ferroelectric film is formed of PZT film or SBT film. However, it is not essential that the ferroelectric film is formed of PZT film or SBT film. Any ferroelectric film can be used. For example, SrBi$_2$(Ta,Nb)$_2$O$_9$ film, (Ba,Sr)TiO$_3$ film, PbTiO$_3$ film, BiTiO$_3$ film, Y1-group film, etc. can be used. PbTiO$_3$ film doped with Ca, La, Nb or Sr, and other films may be used. Materials to be added to the SRO film may be suitably selected corresponding to a material of the ferroelectric film.

In the first to the third embodiments, the ferroelectric film is formed of PZT film, but may be formed of PZT (PLZT) film having La doped by, above 0.1%. The La is doped, whereby characteristics and a lattice constant of the ferroelectrics can be suitably set.

In the first to the third embodiments, a target is sintered SRO. However, a target is not limited to sintered SRO and may be, e.g., SRO formed by hot isostatic press (HIP) or SRO formed by hot press.

In the first to the third embodiments, the SRO film is formed by sputtering. However, the SRO film may be spin coated by CSD, which forms films by using an SRO solution.

In the first to the third embodiments, the SRO film is formed by sputtering. However, the SRO film may be formed by sputtering, CVD or PLD (Pulse Laser Deposition).

As described above, according to the present invention, Pb and Bi are added to the SRO film, whereby the diffusion of the Pb and Bi contained in the ferroelectric film into the SRO film can be suppressed. Accordingly, the present invention can provide a semiconductor device which can realize by using SRO film low-voltage operation and improved hydrogen deterioration resistance.

What is claimed is:

1. A semiconductor device comprising:

a first electrode;

a ferroelectric film formed on the first electrode; and a second electrode formed on the ferroelectric film, the first electrode or the second electrode comprising $SrRuO_x$ film with Pb and/or Bi added.

2. A semiconductor device according to claim 1, wherein the $SrRuO_x$ film is in contact with the ferroelectric film.

3. A semiconductor device according to claim 1, wherein the ferroelectric film is $PbZr_xTi_{1-x}O_3$ film or $SrBi_2Ta_2O_3$ film.

4. A semiconductor device according to claim 2, wherein the ferroelectric film is $PbZr_xTi_{1-x}O_3$ film or $SrBi_2Ta_2O_3$ film.

5. A semiconductor device according to claim 1, wherein an additional amount of Pb or Bi for the ferroelectric film is below 10%.

6. A semiconductor device according to claim 2, wherein an additional amount of Pb or Bi for the ferroelectric film is below 10%.

7. A semiconductor device according to claim 3, wherein an additional amount of Pb or Bi for the ferroelectric film is below 10%.

8. A semiconductor device according to claim 4, wherein an additional amount of Pb or Bi for the ferroelectric film is below 10%.

* * * * *